(12) United States Patent
Dokumaci et al.

(10) Patent No.: US 7,754,569 B2
(45) Date of Patent: Jul. 13, 2010

(54) ANTI-HALO COMPENSATION

(75) Inventors: Omer H. Dokumaci, Wappingers Falls, NY (US); Oleg Gluschenkev, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 268 days.

(21) Appl. No.: 11/928,583

(22) Filed: Oct. 30, 2007

(65) Prior Publication Data

US 2008/0070391 A1 Mar. 20, 2008

Related U.S. Application Data

(62) Division of application No. 10/908,442, filed on May 12, 2005.

(51) Int. Cl.
*H01L 21/336* (2006.01)
(52) U.S. Cl. .................. 438/276; 257/E21.194; 438/275
(58) Field of Classification Search .......... 438/275, 438/276, E21.194; 257/E21.194
See application file for complete search history.

(56) References Cited

U.S. PATENT DOCUMENTS

| | | | |
|---|---|---|---|
| 6,432,777 B1 | 8/2002 | Rausch et al. | |
| 6,548,842 B1 | 4/2003 | Bulucea et al. | |
| 6,562,675 B1 * | 5/2003 | Watt | 438/217 |
| 6,562,713 B1 | 5/2003 | Belyansky et al. | |
| 6,586,294 B1 | 7/2003 | Post et al. | |
| 6,627,963 B2 | 9/2003 | Cochran et al. | |
| 6,657,244 B1 | 12/2003 | Dokumaci et al. | |
| 6,686,637 B1 | 2/2004 | Dokumaci et al. | |
| 6,709,926 B2 | 3/2004 | Chidambarrao et al. | |
| 6,780,694 B2 | 8/2004 | Doris et al. | |
| 6,806,534 B2 | 10/2004 | Dokumaci et al. | |
| 6,908,822 B2 | 6/2005 | Rendon et al. | |
| 6,979,609 B2 * | 12/2005 | Post et al. | 438/217 |
| 2004/0033665 A1 | 2/2004 | Wann | |
| 2004/0110351 A1 | 6/2004 | Narasimha | |

* cited by examiner

*Primary Examiner*—Allan R. Wilson
(74) *Attorney, Agent, or Firm*—Joseph P. Abate; Roberts Mlotkowski Safran & Cole, P.C.

(57) ABSTRACT

An apparatus and method for controlling the net doping in the active region of a semiconductor device in accordance with a gate length is provided. A compensating dopant is chosen to be a type of dopant which will electrically neutralize dopant of the opposite type in the substrate. By implanting the compensating dopant at relatively high angle and high energy, the compensating dopant will pass into and through the gate region for short channels and have little or no impact on the total dopant concentration within the gate region. Where the channel is of a longer length, the high implant angle and the high implant energy cause the compensating dopant to lodge within the channel thereby neutralizing a portion of the dopant of the opposite type.

17 Claims, 7 Drawing Sheets

ANTI-HALO COMPENSATION

CROSS REFERENCE TO RELATED APPLICATIONS

This application is a divisional of U.S. patent application Ser. No. 10/908,442, filed May 12, 2005, the disclosure of which is expressly incorporated by reference herein in its entirety.

BACKGROUND OF INVENTION

1. Field of the Invention

The invention relates to doping of a semiconductor device, and more particularly to controlling dopant concentration of a semiconductor device in accordance with gate length.

2. Background Description

Doping concentration of the active region of a semiconductor device affects many performance characteristics of the semiconductor device. Additionally, the gate length of the active region of a semiconductor device also affects many characteristics of the semiconductor device. For example, for a given doping concentration, as the gate length of the semiconductor device becomes smaller, the semiconductor device becomes more and more susceptible to short channel effects such as punch through and high leakage current. "Punch through" of a semiconductor device means that as the gate length of a semiconductor device becomes smaller, there is a greater tendency for current to flow between the source and drain of the semiconductor device which cannot be controlled by the gate. Accordingly, under certain circumstances, a semiconductor device which experiences punch through will tend to conduct regardless of the voltage applied to the gate. Such a device will also tend to have a high leakage current. A semiconductor chip employing such devices will have high off-state power. Thus, as the semiconductor device becomes smaller, punch through and other short channel effects increase the leakage current of the device and power of the chip.

One method to reduce short channel effects as gate length decreases includes increasing the doping concentration in the active region of the semiconductor device. Accordingly, semiconductor devices with shorter gate lengths benefit from having a higher doping concentration between the source and the drain thereby mitigating short channel effects.

However, higher doping concentration in the active regions of a semiconductor device increases the semiconductor device's threshold voltage. Thus, as a given semiconductor device's doping concentration in the active region is increased to mitigate short channel effects, there is a corresponding increase in the threshold voltage of the semiconductor device. This in turn reduces the drive current of the semiconductor device and reduces the performance of the chip.

Devices with longer gate lengths suffer less from short channel effects than devices with shorter gate lengths, and longer gate devices do not need to have as high doping concentrations in the active region as shorter gate devices. Devices with a long gate channel preferably have a lower doping concentration in the active region relative to the preferred doping concentration in the active region of a short gate device because higher doping concentrations reduce the drive current of a device. Accordingly, devices having short gate lengths benefit from having higher doping concentrations in the active region, and devices with longer gate lengths benefit from having lower doping concentrations in the active region.

Because of process variations, a semiconductor chip or wafer will have multiple semiconductor devices having various gate lengths. In order to maximize the performance/power ratio of the total chip, it is preferable to maximize the ratio of doping concentration in the short channel devices to doping concentration in the long channel devices. Accordingly, the leakage current and off-state power of the short channel devices will be reduced and the drive current and performance of the long channel devices will be increased, thereby increasing the performance of the chip for a given power.

The channel of a semiconductor device can be doped with two different types of dopants, i.e. an acceptor type dopant or a donor type dopant. The concentration of an acceptor type dopant is denoted by NA and a donor type dopant by $N_D$. For an NFET, net doping concentration in the channel is defined as the acceptor type dopant concentration minus the donor type dopant concentration, i.e. $N_A-N_D$, whereas for a PFET, it is defined by $N_D-N_A$. For an NFET, the net doping concentration in the channel should be acceptor type ($N_A>N_D$) to control the short channel effects, while for a PFET, the reverse is true. A donor type dopant in an NFET channel is also referred to as a compensating dopant, whereas in a PFET channel, an acceptor type dopant is referred to as a compensating dopant.

In order to maximize the performance/power ratio of a chip, the net doping concentration in the channel should be as high as possible in short channel devices and as low as possible in long channel devices. For an NFET, one way to achieve this is by making $N_A$ high in short channel devices and low in long channel devices. This can be achieved via. a halo implant which is well known in the art.

SUMMARY OF THE INVENTION

In a first aspect of the invention, a semiconductor device includes a first gate of a first gate length and a second gate of a second gate length, and a dopant under the first gate and the second gate, wherein the density of the dopant under the first gate and the second gate is substantially proportional to a respective gate length.

In another aspect of the invention, a method of doping multiple semiconductor devices includes the steps of forming a dopant concentration substantially proportional to a respective gate length under at least two gates having different gate lengths.

In another aspect of the invention, a method of doping a semiconductor includes the steps of electrically neutralizing a portion of a dopant with a compensating dopant under a gate in proportion to a gate length of the gate.

DETAILED DESCRIPTION OF EMBODIMENTS OF THE INVENTION

Embodiments of the invention improve overall semiconductor chip performance by allowing the net doping concentration in the active region of each semiconductor device to be tailored in accordance with the gate length of the semiconductor device. Thus, embodiments of the invention allow semiconductor devices with longer gate lengths to have lower net doping in the active region without inducing short channel effects in nearby semiconductor devices having shorter channel lengths. In other words, for an NFET, the other way to provide high net doping in short channel devices and low net doping in long channel devices is to make the compensating doping concentration $N_D$ low in short channel devices and high in long channel devices.

In general, embodiments of the invention include a method and structure where an active region of a semiconductor device receives a first or halo dopant and also receives a compensating dopant whose concentration is in proportion to gate length (i.e., a longer gate absorbs more compensating dopant and a shorter gate absorbs less). This is in contrast to typical halo doping where the concentration increases as channel length decreases. Together, the halo dopant plus the compensating dopant result in a larger difference in net doping between a short channel and long channel device than just the halo doping would achieve.

In other words, embodiments of the invention create compensating dopant regions in the channel of FETs such that the amount of compensating dopant concentration decreases when the gate length decreases. This, in turn, increases the effective amount of halo doping in short channel devices more than possible with standard halo implant methods.

Figure 1:
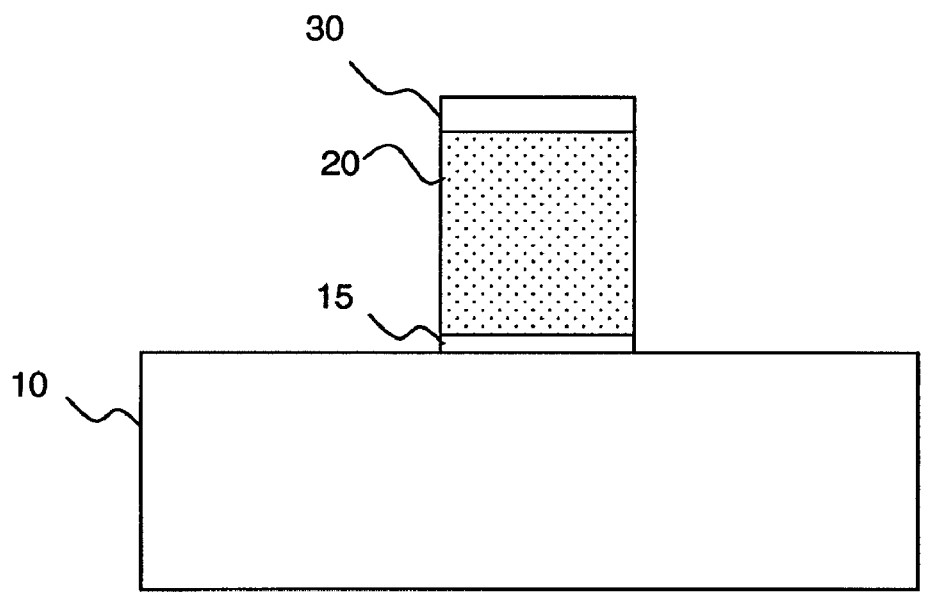
FIGS. 1-8 are cross-sectional views of an embodiment of a method of making a semiconductor device in accordance with the invention.

Referring to FIG. 1, an example of a starting structure for an embodiment in accordance with the invention is shown. In FIG. 1, a substrate 10 has a gate dielectric 15 disposed thereon. The gate dielectric 15 has a gate 20 disposed on its top. The gate dielectric 15 and the gate 20 can be formed by any of the suitable methods for forming the respective structures well known in the art. Thus, the gate dielectric 15 may be formed, for example, from an oxide, a nitride, or high k material. The gate 20 may be formed from, for example, a polysilicon or metal gate material. Also, the gate dielectric 15 and the gate 20 may form a gate stack anywhere in the range of about 10-50 nanometers in length, for example.

Figure 2:
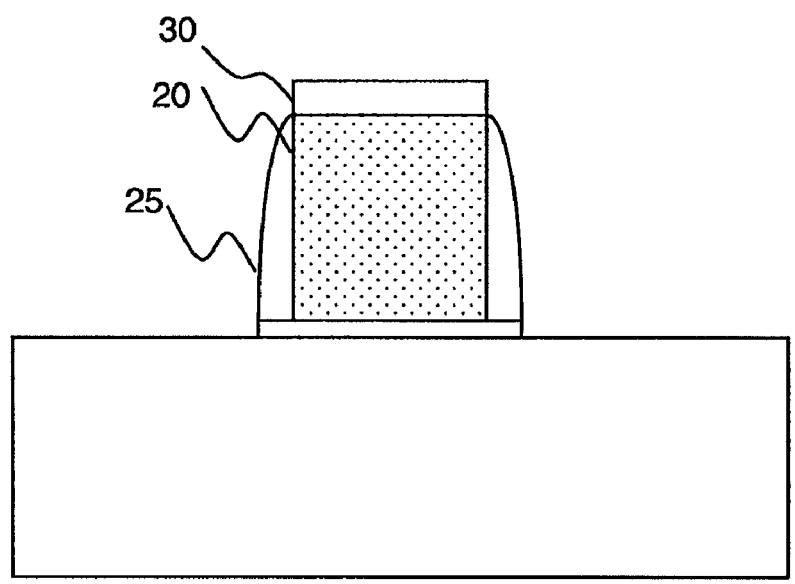

Referring to FIG. 2, first spacers 25 are formed on the sides of the gate 20. The first spacers 25 may be formed by any of the methods well known in the art suitable for forming spacers on the side of a gate. For example, the first spacers 25 may be formed from nitride by any of the appropriate nitride deposition processes such as plasma enhanced chemical vapor deposition (PECVD) or rapid thermal chemical vapor deposition (RTCVD), and then etching the nitride with an anisotropic etching method such as reactive ion etching (RIE). Additionally, the first spacer 25 maybe formed from an oxide using any of the suitable oxide spacer formation techniques well known in the art.

Figure 3:
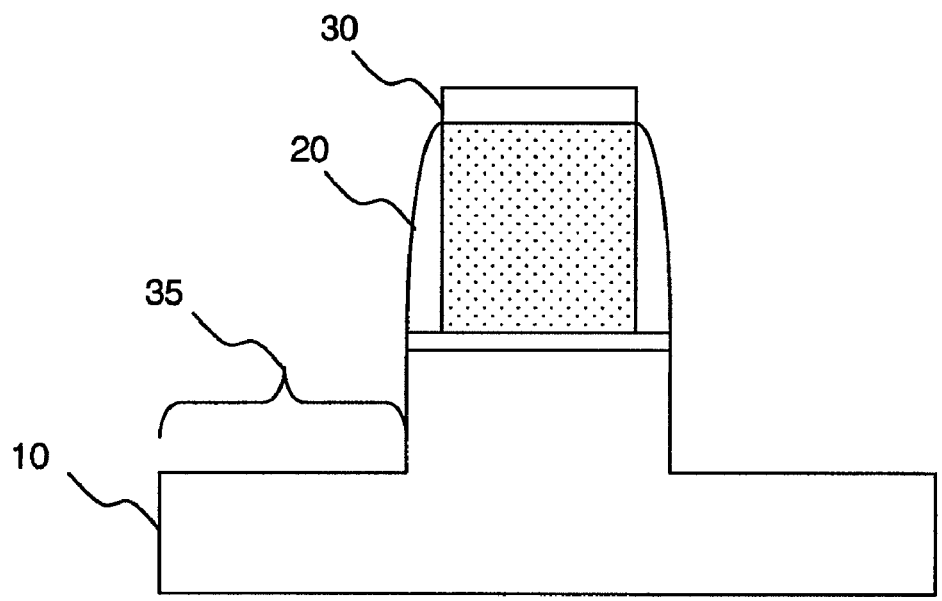

Referring to FIG. 3, a nitride hard mask 30 is formed on top of the gate 20. The nitride hard mask 30 may be formed from nitride, as well as from other materials which are suitably resistant to the following etching step. After the nitride hard mask 30 is formed on top of the gate 20, a selective silicon etch process such as reactive ion etching (RIE) is used to etch the substrate 10 and form trenches 35. Each trench 35 is formed within the substrate 10 on either side of the gate 20.

Figure 4:
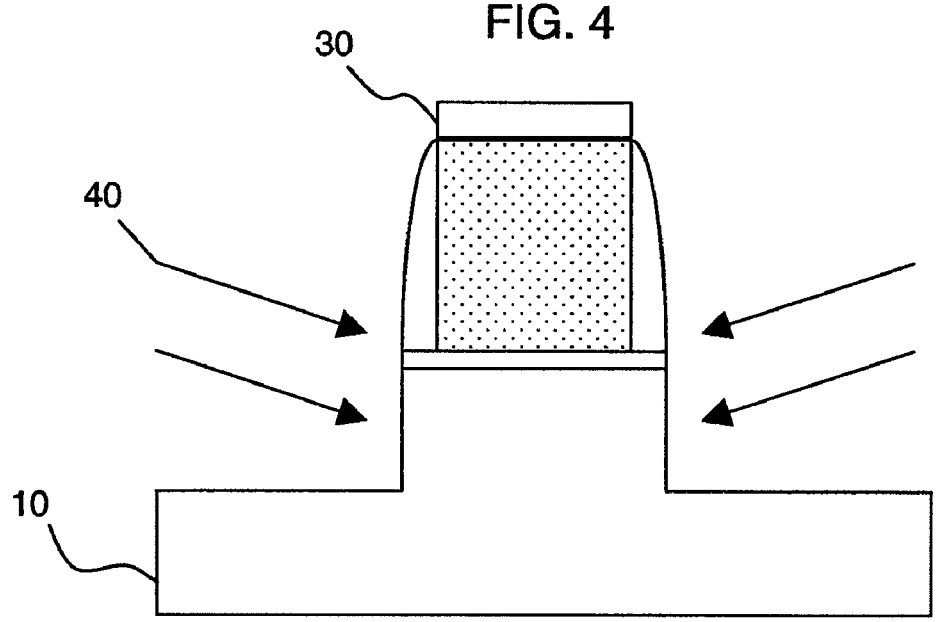

Referring to FIG. 4, an angled compensating implant 40 using a compensating dopant is performed. The type of compensating dopant used in the compensating implant 40 will be opposite of the type of dopants used to subsequently form halo regions in the substrate 10. Accordingly, for an nFET where the halos will be formed from a p-type dopant, the compensating dopant will be an n-type dopant. Alternatively, for a pFET device where the halo implant will be an n-type dopant, the compensating dopant will be a p-type dopant. Examples of n-type dopants include phosphorous (P), arsenic (As), antimony (Sb), etc. Examples of p-type dopants include boron (B), indium (In), boron fluoride ($BF_2$), etc.

The compensating implant 40 is performed at relatively high energy such as, for example, 40 keV for a phosphorous implant. The energy can range from 10 keV to 200 keV depending on the dopant species and the gate length. Additionally, the compensating implant 40 is performed at a relatively high angle from the vertical. For example, the compensating implant 40 may be performed at angles ranging from 45° to less than 90° from the vertical. The implant angle and energy are chosen so that most of the compensating dopant passes through and does not affect the channel of a shorter gate length device while sufficient compensating dopant remains in the channel of a longer gate device to neutralize a portion of the halo dopant in the longer gate device. Typical compensating dopant doses range from about $2\times10^{13}$ cm$^{-2}$ to about $2\times10^{14}$ cm$^{-2}$.

In an alternate embodiment, the substrate 10 is not etched, and thus the trenches 35 are not formed. It should be noted where the substrate 10 is not etched, the halo implant and the compensating implant 40 can be formed in any order. However, where the substrate 10 is etched to form the trenches 35, the compensating implant 40 is best done before the halo implant occurs.

An optional anneal can be done at this step to activate the compensating dopant and remove implant damage. Typical anneal methods include rapid thermal anneal (RTA), flash lamp anneal and laser anneal. Temperature of the anneal can range from 900° C. to 1300° C. Duration of the anneal can range from microseconds to a few seconds.

Figure 5:
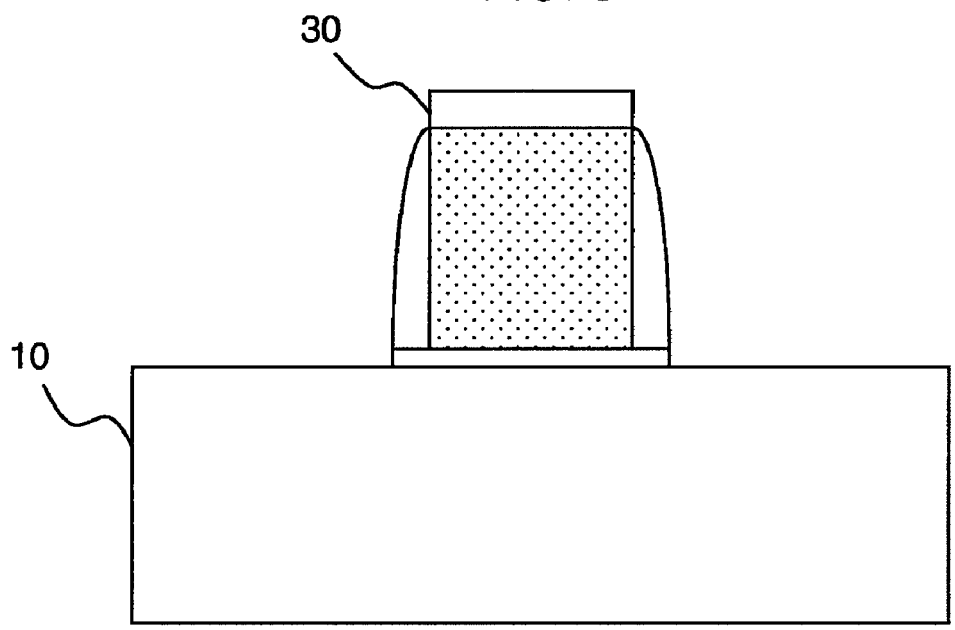

Referring to FIG. 5, a standard regrowth step of the silicon substrate 10 is performed. This can be achieved through a selective epitaxial process, details of which are well known in the art. Thus, the trenches 35 in the substrate 10 are filled with silicon so that the substrate 10 substantially regains its initial starting shape.

Figure 6:
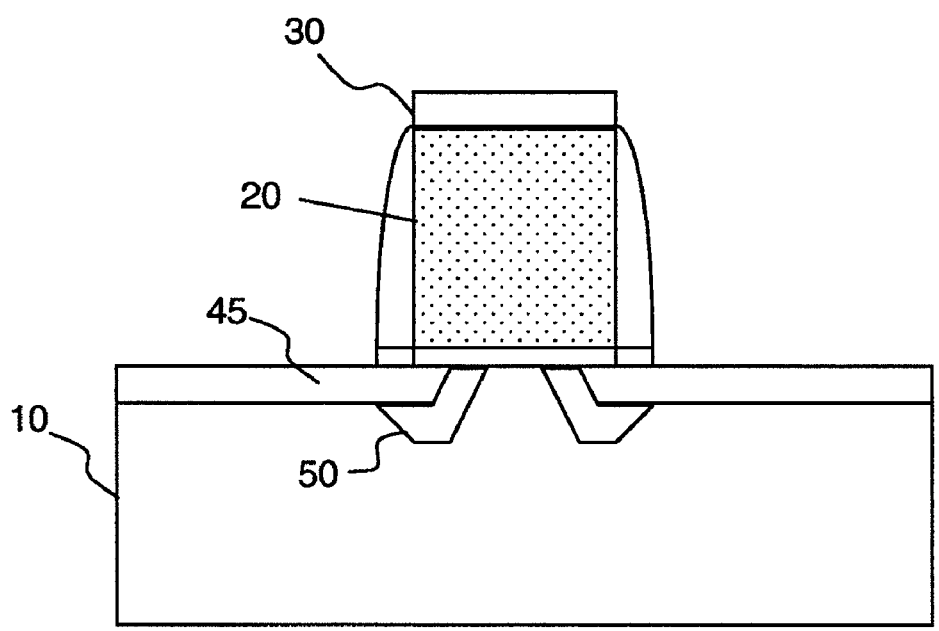

Referring to FIG. 6, extension regions 45 and halo regions 50 are formed in the substrate 10. The halo regions 50 are formed under the gate 20 in the substrate 10. The extensions 45 are formed across the top of the substrate 10 and extend partially under the gate 20. The extension regions 45 are formed from any of the standard dopants for forming extension regions appropriate to the type of device being formed. For example, for an NFET device, the extension regions 45 may be formed from arsenic and phosphorous. For a pFET type device, the extension regions 45 may be formed from, for example, boron or $BF_2$. Typical dopant doses for the extension regions 45 range from $5\times10^{14}$ cm$^{-2}$ to $3\times10^{15}$ cm$^{-2}$. Typical dopant energy levels for the extension regions 45 range from 0.1 keV to 10 keV.

The halo regions 50 may be formed by any of the standard halo implant methods appropriate for the type of device being formed. For example, for an nFET type device, the halo regions may be formed from, for example, boron or indium with doses ranging from $1\times10^{13}$ cm$^{-2}$ to $2\times10^{14}$ cm$^{-2}$, dopant energies ranging from 1 keV to 100 keV and tilt angle ranging from 10° to 45°. For a pFET type device, the halo regions 50 may be formed, for example, arsenic, phosphorous, and/or antimony.

Figure 7:
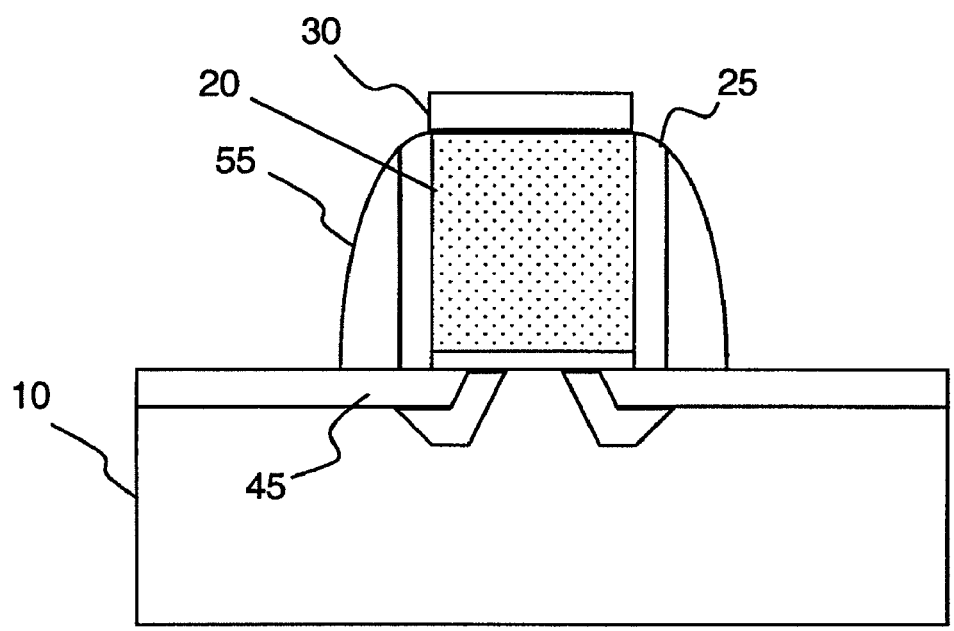

Referring to FIG. 7, source/drain spacers 55 are formed on either side of the first spacer 25. The source/drain spacers 55 are formed above the extension regions 45 in the substrate 10. The source/drain spacers 55 may be formed by any of the standard methods for forming sidewall spacers.

Figure 8:
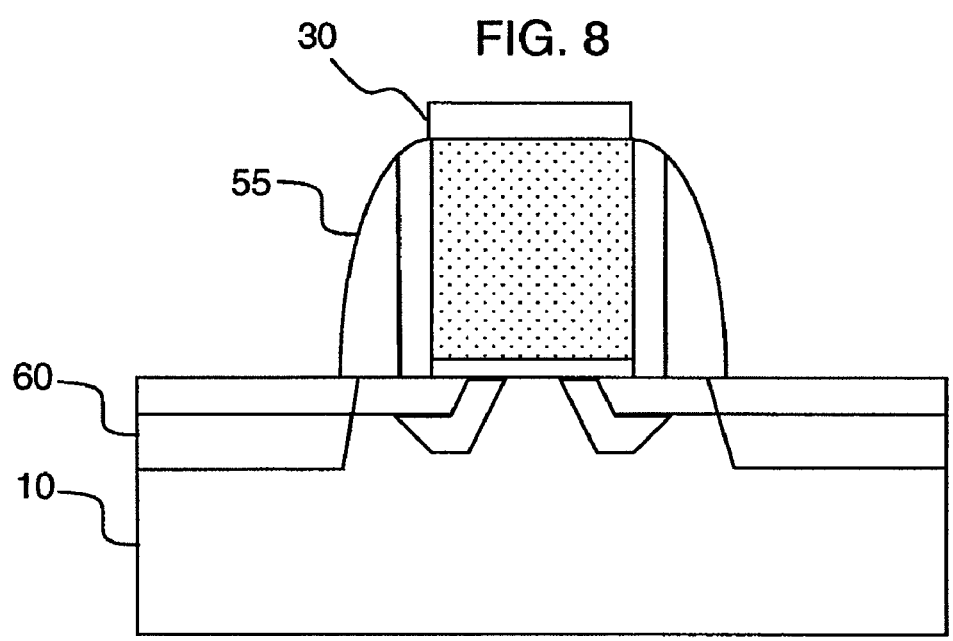

Referring to FIG. 8, source/drain regions 60 are formed. The source/drain regions 60 are formed in the substrate 10 to either side of the source/drain spacers 55. The source/drain region 60 may be formed from any of the dopants appropriate for the type of device being formed. For example, for a nFET device, the source/drain region 60 may be formed from, for example, arsenic or phosphorous. For a pFET type device, the source drain region 60 may be formed from, for example, boron or $BF_2$.

Where the energy is sufficiently high and the implant angle is sufficiently high (such as, for example, greater than 45°), a significant portion of the dopants of the compensating implant 40 will pass through and out of the active region for short channel lengths. For longer channel lengths, more of the compensating implant 40 will be absorbed or stay in the channel. Therefore, a doping region is created where the dopant concentration of the compensating implant 40 increases as the channel length increases, as discussed below in FIG. 10. This is the reverse of a halo implant where the concentration traditionally increases as the channel length decreases.

With the compensating dopant concentration increasing at longer channel lengths, it is possible to achieve a larger delta in channel concentration between a short and a long channel than with a traditional halo only implant, where "delta" is the difference in dopant concentration in a channel as a function of channel length between multiple devices on a semiconductor chip. This improves the threshold voltage versus gate length or roll-off more than a traditional halo only implant, as discussed below in FIG. 11. Even if the dopant concentration is constant as a function of channel length to begin with (i.e. well doping), a difference in dopant concentration between the longer and shorter channel lengths can be achieved by using this technique.

Figure 9:
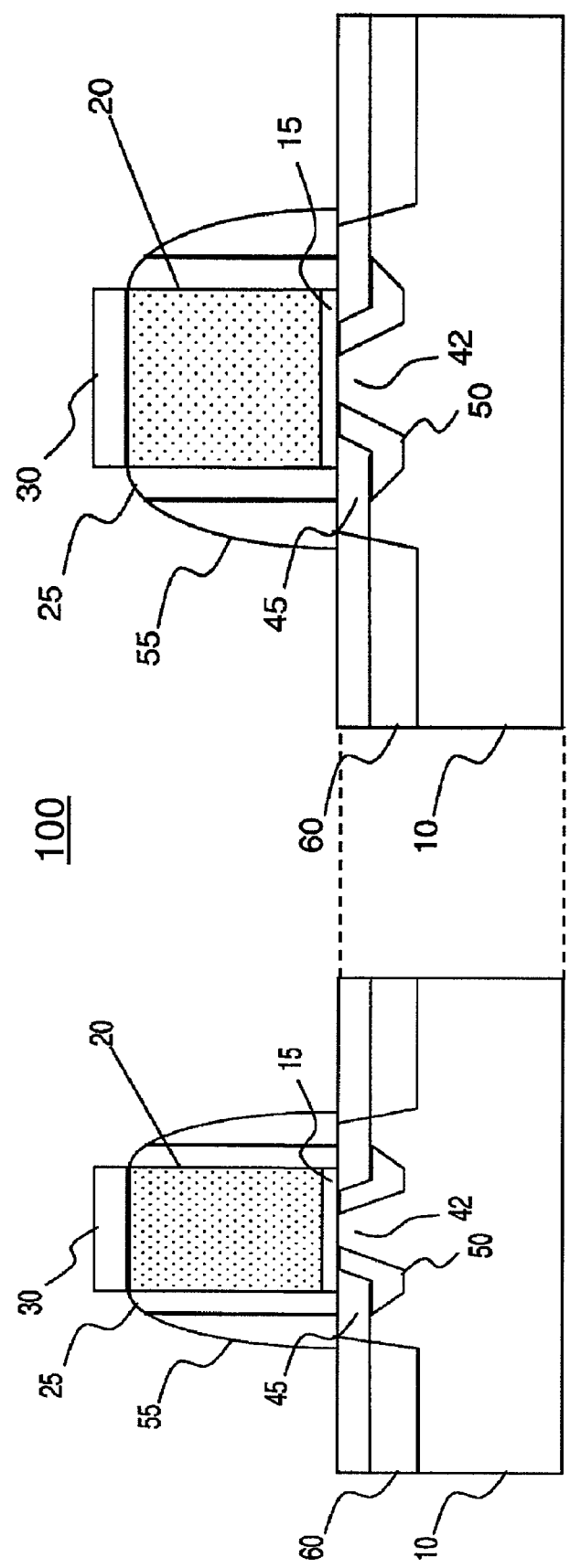
FIG. 9 is a cross-sectional view of an embodiment of a semiconductor device in accordance with the invention.

Referring to FIG. 9, a semiconductor device 100 in accordance with an embodiment of the invention is shown. The semiconductor device has a first gate of a first gate length and a second gate of a second gate length, with similar features represented by like reference characters. The semiconductor device 100 has a substrate 10 with a gate dielectric 15 thereon. On top of the gate dielectric 15 is a gate 20. On either side of the gate 20 is a first spacer 25, and on either side of the first spacer 25 is a source/drain spacer 55. Disposed in the substrate 10 and near the edge of the gate dielectric 15 is a halo region 50. Disposed in the substrate 10, near the outer edge of the source/drain spacer 55, is a source/drain region 60. Extending between the source/drain region 60 and the halo region 50 in the substrate 10 on each side of the gate 20 is an extension 45. Also disposed in the substrate 10 underneath the gate 20 is a compensating dopant region 42. The dopant of the compensating dopant region 42 is a dopant suitable for electrically neutralizing or canceling out the dopants forming the halo region 50.

Thus, the compensating dopant 42 cancels a portion of the halo 50 dopant, and the amount of halo dopant canceled is proportional to gate length (i.e., less cancellation in a shorter gate). In other words, the shorter the gate 20 or channel, the less compensating dopant in the channel, and the longer the gate 20, the more compensating dopant. Consequently, a shorter gate 20 will have less compensating dopant, and more of the halo 50 dopant will be effective after the compensating implant 40. Conversely, a longer gate 20 will have more compensating dopant from the compensating implant 40, and thus less halo 50 dopant will be effective in the channel.

For example, where the semiconductor device is an nFET, the compensating dopant region 42 may be formed from a n-type dopant such as arsenic, phosphorous or antimony. Additionally, the halo region 50 for the nFET type device may be formed from B, or In., deposited with a dose of $1 \times 10^{13}$ $cm^{-2}$ to $2 \times 10^{14}$ $cm^{-2}$ at energies 1 keV to 100 keV. Continuing with the example of a nFET type device, the extension regions 45 may be formed from arsenic or phosphorous deposited with a dose range of $5 \times 10^{14}$ $cm^{-2}$ to $3 \times 10^{15}$ $cm^{-2}$ and energies range of 0.1 keV to 10 keV. Accordingly, the compensating dopant 42 will tend to electrically recombine with a portion of the halo region dopant 50 within the active region to neutralize a portion of the halo region 50 dopant.

As discussed above, the compensating implant dopant will horizontally travel far within the substrate 10, due to performing the compensation implant at high angles from the vertical and at relatively high energies. Thus, for a device 100 having a shorter gate length, the compensating implant will pass through the active region under the gate 20 of the device 100 and the active region of the device 100 will receive relatively little compensating dopant 42. Alternatively, for a device 100 having a longer gate 20, the compensating implant will result in a relatively larger deposition of compensating dopant 42 within the active region of the device 100.

The compensating dopant 42 is an opposite type dopant compared to the halo region 50 dopant, and a portion of the halo implant 50 dopant will be electrically neutralized in proportion to the amount of compensating dopant deposited. Accordingly, the cumulative effect of the halo region 50 and the compensating dopant region 42 will cause devices with short gate lengths to have a relatively high concentration of net doping in the active region and devices with longer gate lengths to have a relatively low concentration of net doping in the active region. The halo region 50 dopant concentration is already low for a long gate and high for a short gate device, but with the compensating dopant region, the difference in net doping between the short and long gate devices increases further. If the halo region 50 is substituted with a well region where the doping is constant as a function of channel length, the compensating dopant region 42 will still provide a difference in net doping between the short and long gate devices.

Figure 10:
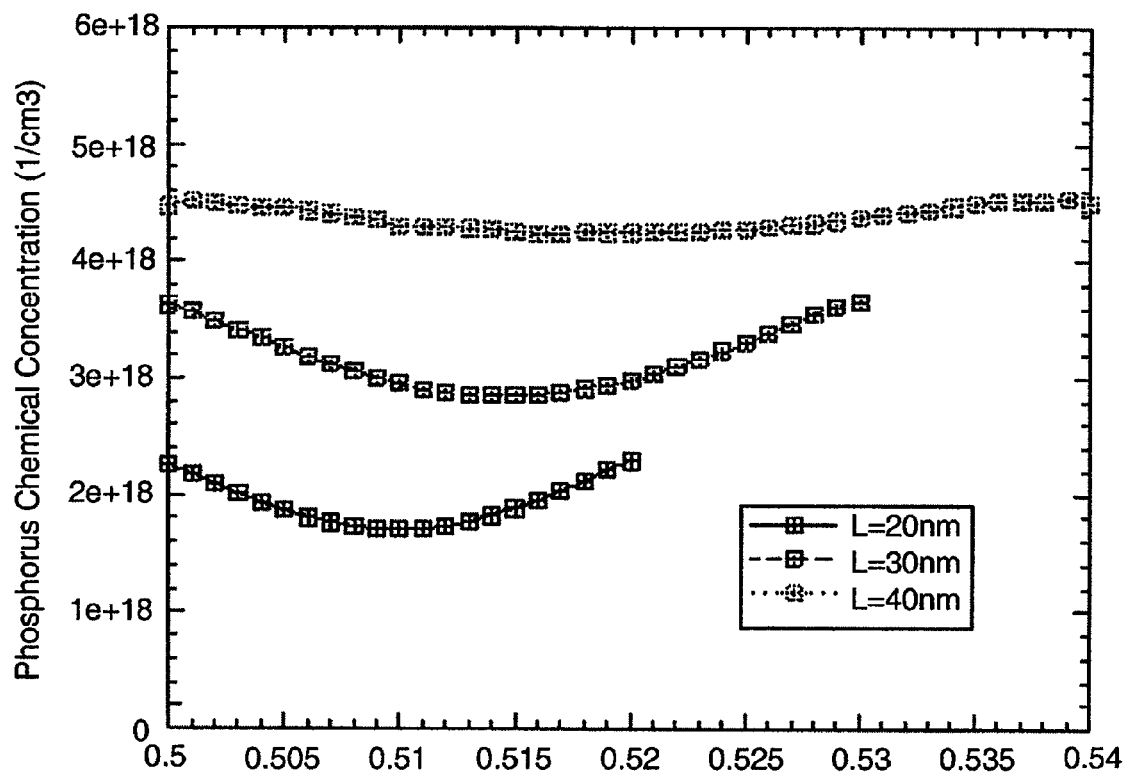
FIG. 10 is a graph of phosphorus chemical concentration versus location in a gate for three different gate lengths in accordance with an embodiment of the invention.

As discussed above, the difference between the concentration of dopant in the active region of devices with long gates as compared to the concentration of dopants in the active region of devices with short gates is called "delta." By increasing the delta on a chip, the overall performance of the chip is improved because the doping of the nominal gate length device is minimized while the doping of the shorter gate length device is maximized Referring to FIG. 10, a graph of phosphorous chemical concentration per cubic centimeter ($cm^3$) versus position in microns is shown for gate lengths of 20 nanometers, 30 nanometers and 40 nanometers. Phosphorous concentration was obtained by the simulation of the phosphorous implant as shown in FIG. 4. The upper curve is for the 40 nanometer gate length, the middle curve is for the 30 nanometer gate length, and the lower curve is for the 20 nanometer gate length. As can be seen from the graph, the concentration of the compensating implant dopant (phosphorous in this example) is relatively uniform across the length of the gate for the 40 nanometer long gate.

The middle curve shows that the concentration of compensating dopant is reduced, especially towards the middle of the gate, for the 30 nanometer gate, with a concentration of about $3.6\times10^{18}$ cm$^{-3}$ at the edges of the gate and dropping below $3.0\times10^{18}$ cm$^{-3}$ near the center of the gate. The bottom curve shows the concentration of compensating dopant to be about $2.2\times10^{18}$ cm$^{-3}$ near the edges of the gate and dropping down to about $1.7\times10^{18}$ cm$^{-3}$ near the center of the gate. Accordingly, the graph of FIG. 10 shows that the concentration of compensating implant dopant is less overall and becomes even less towards the center of a gate for shorter gates thereby having less of a compensation effect for the shorter gates. Thus, the compensating implant has a greater compensating effect for the longer length gates, and the halo dopant in the channel tends to be electrically neutralized more for the longer gates by the compensating implant.

In other words, FIG. 10 shows that where phosphorous was implanted at a high angle (greater than 45 degree) and high energy into the channel as a compensating dopant, the phosphorous concentration increases significantly as the gate length is increased. Phosphorous can be used as compensating dopant in an NFET, although As and Sb may be better choices because of smaller lateral implant spread and B, BF$_2$ or In can be used for a compensating dopant in a pFET.

Figure 11:
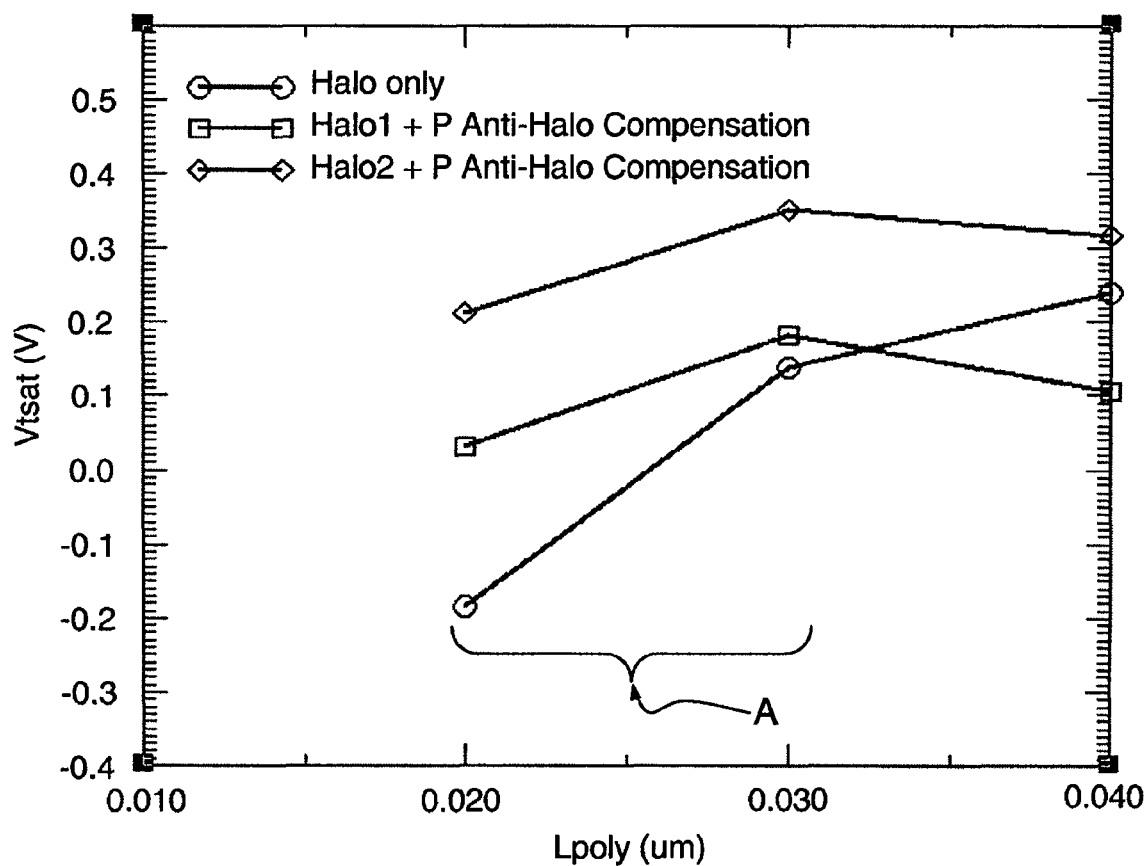
FIG. 11 is a graph of threshold voltage versus gate length for various doping amounts in accordance with an embodiment of the invention.

Referring to FIG. 11, a graph of simulated threshold voltage versus gate length is shown for three different doping configurations. The curve indicated by round data points shows the threshold voltage as function of gate length for a semiconductor device having a halo implant and no compensating implant. The curve indicated by square data points shows the threshold voltage for a doping configuration having a different halo implant and a compensating implant (also referred to as anti-halo compensating), which in this example is phosphorous. The third curve indicated by diamonds is the threshold voltage as a function of gate length for a device having a higher dose halo implant and the same compensating implant of phosphorus.

As can be seen from FIG. 11, the addition of the compensating implant improves the threshold voltage of a semiconductor device at smaller gate lengths. In other words, the device simulations show that the falloff or threshold voltage can be improved by an anti-halo compensating implant. Consequently, the anti-halo compensating allows scaling gate lengths from about 30 nm to about 20 nm while maintaining a practical threshold voltage. The region of the graph labeled "A" shows where improvement in device scalability occurs due to the anti-halo compensating implants. Accordingly, devices with shorter gate lengths have higher threshold voltages with anti-halo implant and thus, there is a reduced penalty in threshold voltage rolloff as the gate length decreases.

As an example, where the doping through the active region is about $1\times10^{19}$/cm$^3$ in the channel, and there is a concentration of about $4\times10^{18}$/cm$^3$ compensating dopant for a 40 nanometer gate in the channel, the net doping concentration for the 40 nanometer gate would be about $6\times10^{18}$/cm$^3$. For a 20 nanometer long gate where the concentration of the dopant is about $1\times10^{19}$/cm$^3$ and the compensating dopant is about $2\times10^{8}$/cm$^3$, the net doping will be about $8\times10^{18}$/cm$^3$. Accordingly, the 20 nanometer long gate will have a higher concentration of net doping than the 40 nanometer gate.

Additionally, high angle, relatively high energy compensating implant can be used to create significant doping differentials in the gate for FETs and additionally in FinFETs, as well. The gate doping differential may be used for Across Chip Linewidth Variation (ACLV) reduction in the gate length for normal FETs. The doping differential in the fins (perpendicular implant to the fin) can be used to reduce threshold voltage variations as a function of fin thickness by putting more compensating dopant in the thicker fins.

Thus, embodiments include a method and device to provide a net doping concentration in an active region of a semiconductor device inversely proportional to gate length. The net doping concentration is tailored to gate length by adding a compensating implant proportional to gate length (longer gate receives more compensating dopant) and electrically neutralizing a portion of the halo or well dopant. The amount of compensating dopant deposited within the active region of the gate is controlled by implanting the compensating dopant at a relatively high angle from the vertical and at a high energy so that most or all of the compensating dopant passes through the active region for smaller gates and more compensating dopant remains in the active region or channel for larger gates.

While the invention has been described in terms of exemplary embodiments, those skilled in the art will recognize that the invention can be practiced with modifications and in the spirit and scope of the appended claims.

What is claimed is:

1. A method of doping multiple semiconductor devices, comprising:
   etching a substrate on either side of at least two gates having differing gate lengths; and
   forming a dopant concentration substantially proportional to a respective gate length under the at least two gates having differing gate lengths by implanting a compensating dopant into the etched substrate under each gate of the at least two gates in proportion to a respective gate length of each of the respective gates.

2. The method of claim 1, wherein the compensating dopant is configured to electrically neutralize a portion of dopant under each gate of the at least two gates in proportion to gate length.

3. The method of claim 1, wherein the implanting the compensating dopant comprises implanting the compensating dopant at an angle relative to a vertical line and energy such that a substantial portion of the compensating dopant passes from under the gate of the shortest gate of the at least two gates having different gate lengths.

4. The method of claim 1, wherein:
   the at least two gates comprises a first gate having a first gate length and a second gate having a second gate length;
   the second gate length is greater than the first gate length; and
   the implanting the compensating dopant comprises implanting the compensating dopant at an implant energy and at an implant angle between 45° and less than 90° relative to vertical;
   further comprising choosing the implant angle and the implant energy to cause respective amounts of the compensating dopant to pass through the respective first and second gates such that a higher concentration of the compensating dopant is implanted under the second gate than under the first gate.

5. A method of doping a semiconductor, comprising: etching a substrate on either side of a gate, electrically neutralizing a portion of a dopant with a compensating dopant under a gate in proportion to a gate length of the gate, wherein the neutralizing comprises angle-implanting the compensating dopant into an etched portion of the substrate at an angle ranging from 45° to less than 90° relative to a vertical line.

6. The method of claim 5, wherein the angle-implanting the compensating dopant comprises implanting the compensating dopant under the gate substantially proportional to the gate length of the gate.

7. The method of claim 5, wherein the angle-implanting the compensating dopant comprises implanting the compensating dopant to allow higher concentration of compensating dopant to be implanted under a gate for a longer gate than for a shorter gate such that the density of compensating dopant is proportional to gate length.

8. The method of claim 5, wherein the angle-implanting the compensating dopant comprises implanting the compensating dopant at an implant energy ranging from about 10 keV to 200 keV.

9. The method of claim 5, wherein:
the dopant comprises a p-type for an nFET semiconductor device and an n-type for a pFET semiconductor device, and
the compensating dopant comprises a n-type for an nFET semiconductor device and an p-type for a pFET semiconductor device.

10. The method of claim 5, wherein the angle-implanting the compensating dopant comprises implanting the compensating dopant such that a portion of the compensating dopant passes through and does not affect a channel of the gate.

11. A method of doping a semiconductor, comprising:
forming a gate insulator on a substrate;
forming a gate on the gate insulator;
forming trenches in the substrate on either side of the gate;
implanting a compensating dopant into the substrate under the gate through the trenches, wherein the amount of the compensating dopant implanted under the gate is proportional to a gate length of the gate;
filling the trenches by re-growing the substrate; and
forming halo regions by implanting a halo dopant in the substrate under the gate,
wherein the compensating dopant neutralizes an amount of the halo dopant, and the amount of the halo dopant neutralized is proportional to the gate length.

12. The method of claim 11, wherein, during the implanting the compensating dopant, a portion of the compensating dopant passes through a channel of the gate and does not affect the channel of the gate.

13. The method of claim 12, further comprising choosing an implant angle and an implant energy to control an amount of the portion of the compensating dopant that passes through.

14. The method of claim 13, wherein:
the implant angle is from 45° to less than 90° from vertical; and
the implant energy is from 10 keV to 200 keV.

15. The method of claim 14, further comprising:
forming spacers on sides of the gate and on top of the gate insulator; and
forming a nitride mask on top of the gate,
wherein the forming the trenches comprises etching the substrate.

16. The method of claim 11, further comprising:
forming a second gate insulator on the substrate;
forming a second gate on the second gate insulator;
forming second trenches in the substrate on either side of the second gate; and
implanting the compensating dopant into the substrate under the second gate through the trenches, wherein the amount of the compensating dopant implanted under the second gate is proportional to a second gate length of the second gate,
wherein the second gate length is greater than the first gate length; and
the amount of the compensating dopant implanted under the second gate is more than the amount of the compensating dopant implanted under the first gate.

17. The method of claim 16, further comprising choosing an implant angle and an implant energy such that a higher concentration of the compensating dopant is implanted under the second gate than under the first gate.

* * * * *